(12) United States Patent
van Os et al.

(10) Patent No.: US 6,375,750 B1
(45) Date of Patent: *Apr. 23, 2002

(54) PLASMA ENHANCED CHEMICAL PROCESSING REACTOR AND METHOD

(75) Inventors: Ron van Os, Sunnyvale; William J. Durbin, Capitola; Richard H. Matthiesen, San Jose; Dennis C. Fenske, Felton; Eric D. Ross, Santa Cruz, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/575,217

(22) Filed: May 18, 2000

Related U.S. Application Data

(63) Continuation of application No. 09/092,565, filed on Jun. 5, 1998, now Pat. No. 6,178,918, which is a continuation of application No. 08/909,580, filed on Aug. 12, 1997, now Pat. No. 5,792,272, which is a continuation of application No. 08/500,493, filed on Jul. 10, 1995, now abandoned.

(51) Int. Cl.$^7$ .............................................. C23C 16/00
(52) U.S. Cl. ........................................ 118/728; 118/500
(58) Field of Search .............................. 118/500, 728, 118/729; 204/298.15; 156/345

(56) References Cited

U.S. PATENT DOCUMENTS

| 3,634,740 A | 1/1972 | Stevko .................... 317/262 E |
| 3,916,270 A | 10/1975 | Wachtler et al. ......... 317/262 E |
| 4,184,188 A | 1/1980 | Briglia ......................... 361/234 |
| 4,282,267 A | 8/1981 | Kuyel ............................ 427/38 |
| 4,292,153 A | 9/1981 | Kudo et al. .................. 204/164 |
| 4,313,783 A | 2/1982 | Davies et al. ............... 156/643 |
| 4,324,611 A | 4/1982 | Vogel et al. ................. 156/643 |

(List continued on next page.)

FOREIGN PATENT DOCUMENTS

| EP | 0660499 A1 | 6/1995 | .......... H02N/13/00 |
| EP | 0668608 A1 | 8/1995 | .......... H01L/21/00 |
| EP | 0697467 A1 | 2/1996 | .......... C23C/16/44 |
| JP | 61-64124 | 4/1986 | ......... H01L/21/205 |
| JP | 63-292625 | 11/1988 | |
| JP | 1-276736 | 11/1989 | ........... H01L/21/68 |
| JP | 2-271626 | 11/1990 | ........... H01L/21/31 |
| JP | 3-76112 | 2/1991 | ......... H01L/21/205 |
| JP | 6-280000 | 4/1994 | ........... C23C/14/22 |
| JP | 7161695 | 6/1995 | ....... H01L/21/3065 |
| WO | WO 97/03224 | 1/1997 | ........... C23C/16/00 |

OTHER PUBLICATIONS

Lucovsky, G., "Deposition of silicon dioxide and silicon nitride by remote plasma enhanced chemical vapor deposition", Journal of Vacuum Science & Technology, vol. 4, No. 3, May–Jun. 1986.

International Search Report, EP 97/305257, dated Apr. 14, 1998, 5 pages.

International Search Report, EP 97/305257, dated Nov. 21, 1997, 4 pages.

*Primary Examiner*—Jeffrie R. Lund
(74) *Attorney, Agent, or Firm*—Moser, Patterson & Sheridan

(57) ABSTRACT

An apparatus for processing a substrate comprising a processing chamber and a substrate support system comprising an electrostatic chuck having a body portion and a substrate support surface and one or more arms extending from the body portion to mount the electrostatic chuck to a side wall portion of the processing chamber is provided.

15 Claims, 10 Drawing Sheets

U.S. PATENT DOCUMENTS

| | | | |
|---|---|---|---|
| 4,365,588 A | * 12/1982 | Jolly | 118/732 |
| 4,384,918 A | 5/1983 | Abe | 156/643 |
| 4,399,016 A | 8/1983 | Tsukada et al. | 204/192 R |
| 4,431,473 A | 2/1984 | Okano et al. | 156/345 |
| 4,512,391 A | 4/1985 | Harra et al. | 165/48 R |
| 4,514,636 A | 4/1985 | King | 250/443.1 |
| 4,680,061 A | 7/1987 | Lamont, Jr. | 148/1.5 |
| 4,705,951 A | 11/1987 | Layman et al. | 250/442.1 |
| 4,760,244 A | * 7/1988 | Hokynar | 219/390 |
| 4,771,730 A | 9/1988 | Tezila | 118/723 |
| 4,808,258 A | 2/1989 | Otsubo et al. | 156/643 |
| 4,960,488 A | 10/1990 | Law et al. | 156/643 |
| 4,968,374 A | 11/1990 | Tsukada et al. | 156/345 |
| 4,990,229 A | 2/1991 | Campbell et al. | 204/298.06 |
| 5,099,571 A | 3/1992 | Logan et al. | 29/825 |
| 5,221,450 A | 6/1993 | Hattori et al. | 204/192.32 |
| 5,234,529 A | 8/1993 | Johnson | 156/345 |
| 5,325,261 A | 6/1994 | Horwitz | 361/234 |
| 5,330,610 A | * 7/1994 | Eres et al. | 117/86 |
| 5,365,057 A | 11/1994 | Morley et al. | 250/214 VT |
| 5,382,311 A | 1/1995 | Ishikawa et al. | 156/345 |
| 5,401,350 A | 3/1995 | Patrick et al. | 156/345 |
| 5,403,434 A | 4/1995 | Moslehi | 156/643 |
| 5,433,812 A | 7/1995 | Cuomo et al. | 156/345 |
| 5,452,177 A | 9/1995 | Frutiger | 361/234 |
| 5,452,510 A | 9/1995 | Barnes et al. | 29/825 |
| 5,460,684 A | 10/1995 | Saeki et al. | 156/345 |
| 5,467,249 A | 11/1995 | Barnes et al. | 361/234 |
| 5,522,131 A | 6/1996 | Steger | 29/829 |
| 5,525,159 A | 6/1996 | Hama et al. | 118/723 I |
| 5,539,609 A | 7/1996 | Collins et al. | 361/234 |
| 5,688,357 A | 11/1997 | Hanawa | 156/345 |
| 5,767,628 A | 6/1998 | Keller et al. | 315/111.51 |
| 5,792,261 A | 8/1998 | Hama et al. | 118/723 I |
| 5,792,272 A | 8/1998 | Van Os et al. | 118/723 IR |
| 5,824,607 A | 10/1998 | Trow et al. | 438/732 |
| 5,958,134 A | * 9/1999 | Yasar et al. | 118/50 |
| 6,027,601 A | 2/2000 | Hanawa | 156/345 |
| 6,178,918 B1 | * 1/2001 | Van Os et al. | 118/723 R |

* cited by examiner

PLASMA ENHANCED CHEMICAL PROCESSING REACTOR AND METHOD

The present application is a continuation application of U.S. application Ser. No. 09/092,565, now U.S. Pat. No. 6,178,918, which was filed on Jun. 5, 1998, and issued on Jan. 30, 2001. Furthermore, the present application claims priority to U.S. patent application Ser. 08/909,580, which is now U.S Pat. No. 5,792,272, filed on Aug. 12, 1997, which is a continuation of U.S. patent application Ser. No. 08/500,493, filed Jul. 10, 1995 now abandoned.

BRIEF DESCRIPTION OF THE INVENTION

This invention relates to a reactor and method for processing semiconductor integrated circuits. More particularly, the invention relates to a plasma enhanced reactor and method capable of performing processing operations including depositing uniform films or layers on the surface of integrated circuits by plasma enhanced chemical vapor deposition (PECVD), film etchback, reactor self-clean, and simultaneous etch and deposit operations.

BACKGROUND OF THE INVENTION

The processing of semiconductor wafers and other integrated circuits (IC) includes critical manufacturing steps such as etching wafer surfaces and depositing layers of material on wafer surfaces to form device components, interconnecting lines, dielectrics, insulating barriers and the like. Various systems have been employed to deposit layers of material and the like on the surface of integrated circuits, and often such layers are formed by chemical vapor deposition (CVD). A conventional thermal CVD process deposits a stable chemical compound on the surface of a wafer by thermal reaction of certain gaseous chemicals. Various CVD reactors have been used in the art including low pressure CVD systems and atmospheric pressure CVD systems.

More recently, plasma enhanced (sometimes called plasma assisted) CVD systems (PECVD) have been developed. PECVD systems generally operate by disassociation and ionization of gaseous chemicals. The high electron temperatures associated with the plasma increase the density of the disassociated species available for deposition on the wafer surface. Accordingly, such systems are able to operate at lower temperatures than conventional thermal CVD systems. Such lower temperature processes are desirable and minimize diffusion of shallow junctions and inter-diffusion of metals contained within the integrated circuits. Moreover, PECVD systems are suitable for forming multiple dielectric layers to be used to isolate stacked device features as device densities increase. When forming such multilayer dielectric layers it is desirable to provide a layer with good gap fill, isolation, stress and step coverage properties. These properties become more difficult to attain as device dimensions shrink.

In PECVD systems, the reactor is typically operated at low pressures during processing of the semiconductors. Such low pressures present particular gas flow dynamics considerations that must be addressed With low pressures, the collision rate of the active species is relatively low and the mean-free path of the species is relatively long. Accordingly, it is desirable to provide a reactor capable of uniform, controlled gas flow within the process chamber, across the wafer, and to the exhaust, thus providing uniform processing of the wafer. Moreover, other operating pressures may be used for various processes, and thus it is desirable for the reactor to be capable of operating over a large pressure range.

Cleaning of the reactor plays an important role in the effective operation of a system. The highly reactive species deposit on the walls of the chamber, and the operating components, as well as on the surface of the substrate. Such deposits affect the operation of the system, may affect the plasma potentials within the system, and are a serious source of particulates which may end up contaminating the deposited film. Accordingly it is advantageous to provide a reactor design capable of self cleaning.

OBJECTS AND SUMMARY OF THE INVENTION

It is an object of this invention to provide a reactor for processing semiconductor wafers and integrated circuits.

More particularly, it is an object of this invention to provide an improved reactor for processing wafers by depositing films or layers on the surface of such wafers by plasma enhanced chemical vapor deposition (PECVD).

Another object of this invention is to provide a reactor which is capable of operating over a wide pressure range.

Another object of this invention is to provide a reactor capable of depositing desired films and simultaneously etching such films.

Yet another object of the invention is to provide a reactor capable of self-cleaning.

A related object of this invention is to provide a reactor which improves the quality of films deposited on wafers.

These and other objects are achieved by the reactor herein disclosed generally comprising a plasma chamber communicating with a process chamber. The plasma chamber includes a first gas injection manifold for receiving at least a first gas; and a source of electromagnetic energy which excites the gas to form a plasma. The process chamber includes a wafer support for supporting a wafer to be processed, and a second gas manifold which encircles the wafer support and directs reactive gases toward the wafer support. The plasma generated in the plasma chamber extends into the process chamber and interacts with the reactive gases to deposit a layer of material on the wafer. A vacuum system communicates with the process chamber for exhausting the reactor.

The invention also includes a method of operating a reactor having a plasma chamber and a process chamber with a wafer support disposed within the process chamber, which includes the steps of generating a plasma within the plasma chamber, introducing at least one gaseous chemical into the process chamber proximate to the wafer support and applying an RF gradient to induce diffusion of the plasma to the area proximate the wafer support, whereby the plasma and the gaseous chemical interacts proximate the wafer support to form a layer of material on the surface of the wafer.

BRIEF DESCRIPTION OF THE DRAWINGS

Other objects and advantages of the invention become apparent upon reading of the detailed description of the invention and the appended claims provided below, and upon reference to the drawings in which:

FIG. 3c is an enlarged cross-sectional view of the holes in the manifold of FIG. 3a.

DETAILED DESCRIPTION OF THE INVENTION

A. Overview

Figure 1:
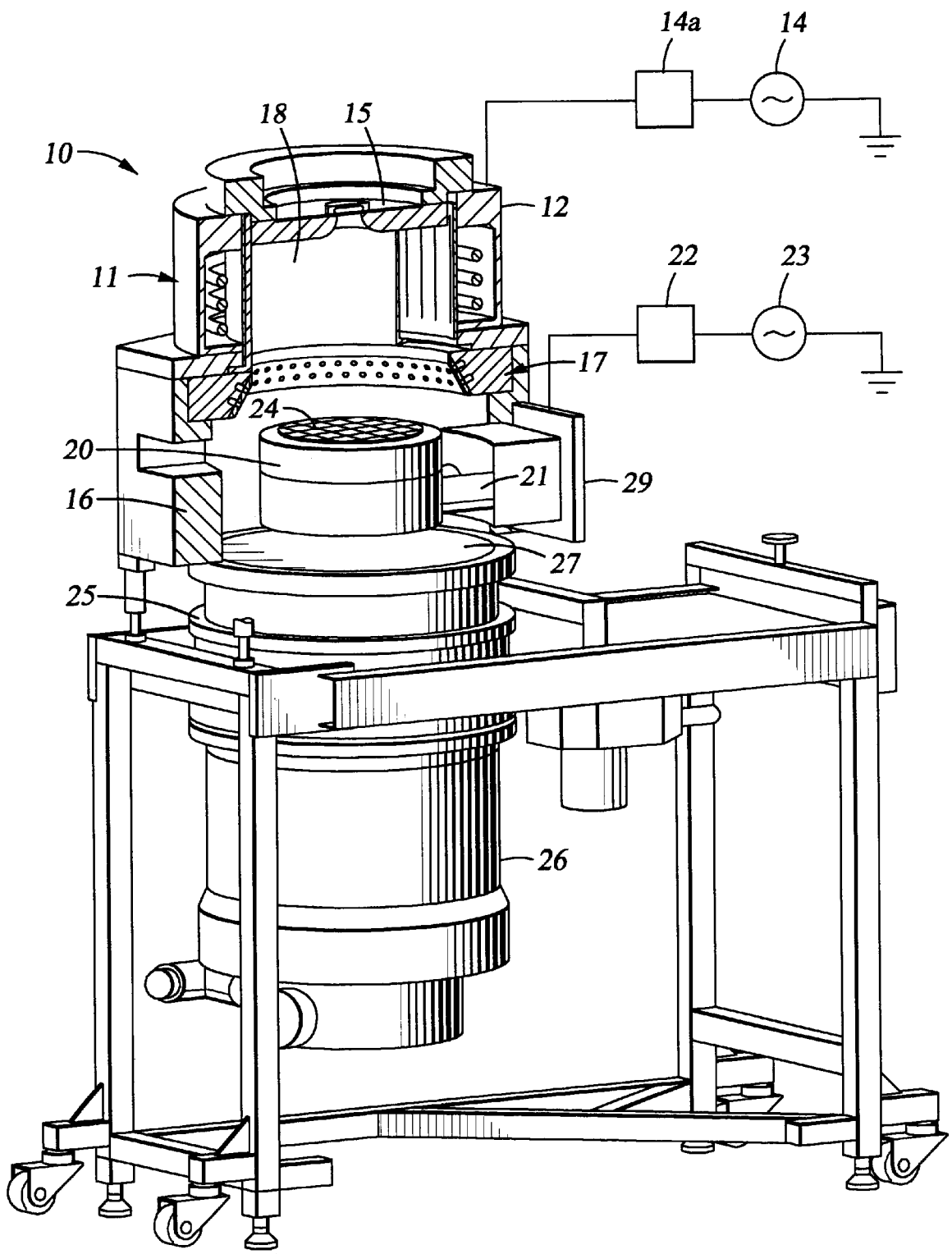
FIG. 1 is a partly broken away assembly view of the reactor according to one embodiment of the invention.
Figure 2:
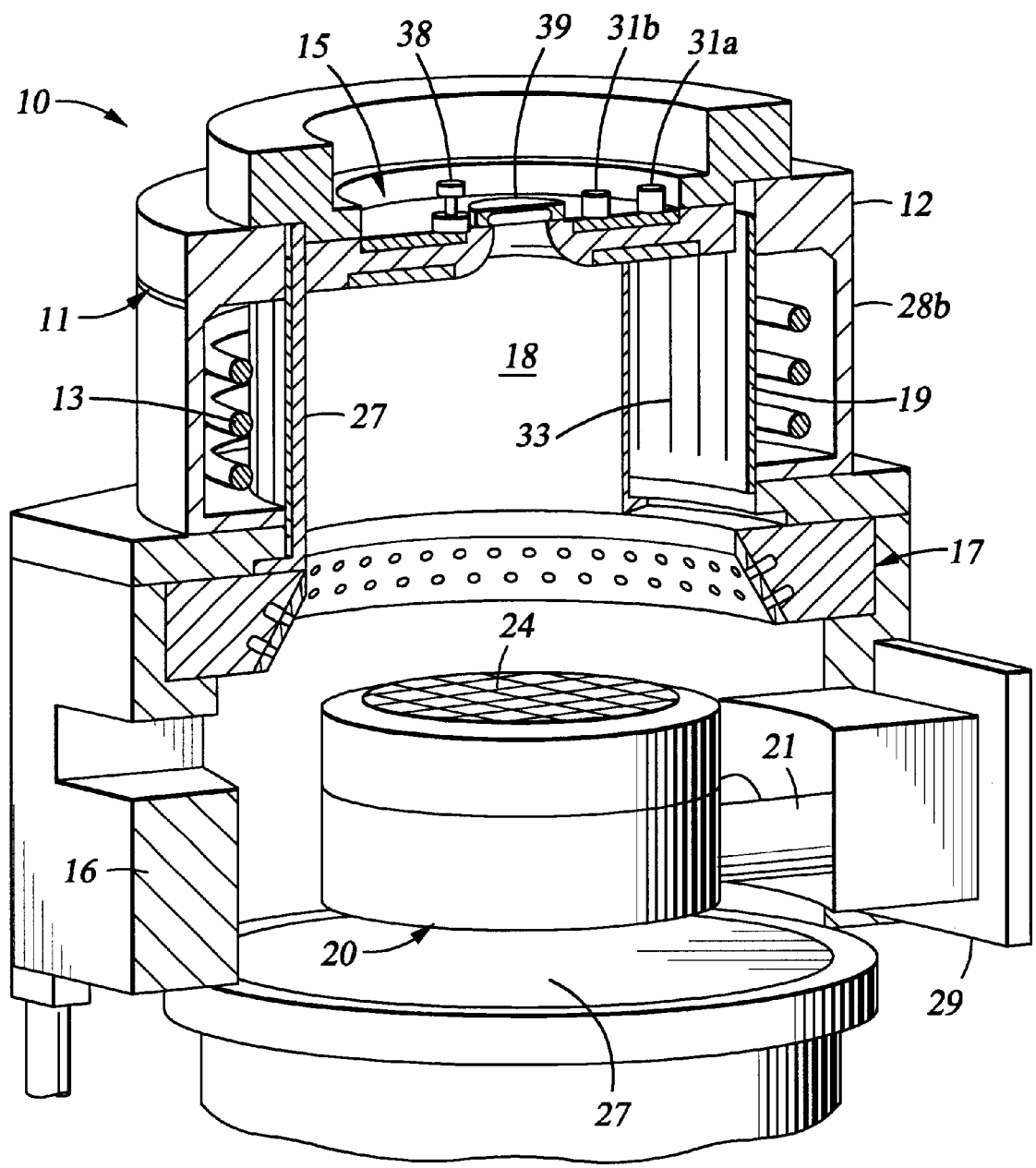
FIG. 2 is an enlarged partially broken away cross-sectional view of the plasma chamber and process chamber of the reactor as shown in FIG. 1.

Turning to the drawings, wherein like components are designated by like reference numbers in the figures, FIGS. 1 and 2 represent one embodiment of the reactor in accordance with this invention. FIG. 1 illustrates an assembly view of the invention wherein reactor 10 generally comprises a plasma assembly 11 and a process chamber 16. The plasma assembly 11 which includes a plasma generating source 12, the interior of such source 12 forms a plasma chamber 18, and a first gas injection refold 15 forms the top of the chamber. The first manifold 15 conveys at least one gaseous chemical to plasma chamber 18. The plasma assembly 11 is operatively attached to process chamber 16. Process chamber 16 generally includes a second gas injection manifold 17, which is mounted to process chamber 16, for receiving at least a second gaseous chemical via gas delivery lines (not shown). Preferably, the gas injection manifold 17 is mounted near the top of chamber 16 with an outer peripheral surface being mounted along the wall of process chamber 16, thus forming a continuous ring. Further, positioned within chamber 16 is a horizontal wafer support 20 (often referred to as a "chuck") for supporting a wafer 24. Preferably, wafer support 20 is attached to chamber 16 by arm member 21 such that the wafer support 20 is suspended within the process chamber 16. A wafer 24 is placed on the wafer support 20 whereby the surface of the wafer 24 is facing upwards. The wafer support 20 may be biased by applying r.f energy from generator 23 via matching network 22.

A vacuum system is provided for exhausting the reactor 10. A vacuum pump 26 is operatively coupled to the process chamber 16, by port 25. Preferably, vacuum pump 26 is substantially axially aligned with the process chamber 16 (referred to as an "on-axis pump") which provides improved flow control of the gases and plasma within the reactor 10. As discussed in detail below, the suspended wafer support 20 and the on-axis pumping form a unique gas distribution system which is designed to provide symmetrical flow of gases within the reactor 10, and particularly to promote uniform deposition and/or etching across the wafer 24.

The inventive reactor is adapted for performing various processing operations including deposition, film etchback, reactor self-clean and simultaneous etch and deposition steps. In an exemplary embodiment of the deposition operation, silane and ariupture of oxygen and argon are conveyed into the process chamber 16 via second gas injection manifold 17. During the deposition operation, the first gas injection manifold may be inoperative, and in this configuration, oxygen and argon molecules migrate into the plasma chamber 18 from the process chamber 16 where they are originally injected, and are ionized in plasma chamber 18. Alternatively, the first gas injection manifold 15 may be operative whereby argon and oxygen are conveyed into the plasma chamber via first gas manifold 15. Furthermore in yet another embodiment, oxygen and argon are conveyed through both the first gas injection manifold 15 and the second gas injections manifold 17.

During a reactor selfclean operation, a chemical such as $CF_4$, $C_2F_4$ or $NH_3$ is injected into the plasma chamber via first gas injection manifold 15, whereby the gases are ionized and then flow through the reactor 10 to remove unwanted deposits on the surfaces of the chambers 16 and 18 and associated components. Alternatively, the deaning chemicals may be injected into the reactor via second gas injection manifold 17, or conveyed by both the first gas injection manifold 15 and the second gas injection manifold 17. Moreover, the reactor is adapted for application of an r.f. and dc bias induced at the wafer support for inducing a film etch-back operation and for simultaneous etch/deposit operation. The reactor and methods are described in further detail below.

B. Plasma Chamber

The plasma assembly 11 can be appreciated in further detail with reference to FIG. 2. Plasma assembly 11 includes a source of electromagnetic energy 12, commonly referred to as a "plasma source" for generating a plasma within the plasma chamber 18. Preferably the plasma source 12 is Qf xhe type classified in the art as inductively coupled plasma (ICP). In the preferred embodiment as shown in FIG. 2, the plasma source 12 is cylindrical and includes a helical coil 13 made of metal and a slotted electrostatic shield 19 made of a nonmagnetic material, said shield 19 being generally disposed within the coil 13. The coil 13 and shield 19 are housed within an enclosure having an inner 27 and outer 28 wall Preferably, the inner wall 27 is made of a low loss insulating material, such as quartz or ceramic, and the outer wall may be comprised of a metal. Plasm is generated in the plasma chamber 18 formed within the plasma source 12. This preferred embodiment of plasma source 12 is more fully described in U.S. Pat. No. 5,234,529 which is incorporated herein by reference.

A plurality of longitudinally extending and circumferentially spaced slits 33 are formed in the shield 19. The shield 19 is used to decouple capacitive electric fields. The shield 19 reduces the capacitive coupling between the coil 13 and the plasma chamber 18 where the plasma is generated. In one embodiment, the plasma source 12 and shield 19 attempts to fully shield all capacitive components. Preferably, the shield is grounded. Capacitively coupled fields couple very efficiently with the plasma, and produce large and generally uncontrollable r.f. plasma potentials. Such a plasma is referred to as a "hot plasma." The hot plasma comprises very high plasma particulate energies, particularly high electron temperatures ($T_c$). The resulting high plasma potential damages the reactor by the attack of high energy particles at the chamber walls and other components of the reactor. This reduces the life of the reactor and creates metal particulate contamination which often ends up in the deposited film, thereby destroying the wafer. Moreover, the high plasma potential may adversely affect the wafer being processed By employing the shield 19, the capacitive coupling is reduced to a desired amount, and by varying the slot openings 33 in the shield 19, the amount of capacitive coupling can be varied depending upon the application. For example, during a clean operation where the reactor 10 is cleaned to remove unwanted deposition of material on the surfaces of the reactor 10, greater capacitive coupling may be employed thereby creating a higher energy plasma to promote rapid cleaning.

To generate the plasma, according to one embodiment of the invention, at least one gas is delivered to the plasma chamber 18 by first gas injection manifold 15. The r.f. energy 14 is directed into plasma source 12 through coils 13 arranged around plasma chamber 18 which excites the gases in the plasma chamber 18 into a plasma state. In a plasma state a large percentage of the gaseous molecules introduced are dissociated to form reactive species, including ionized atoms. Preferably, an ion density of greater than $10^{11}$ ions/$cm^3$ is achieved, and is referred to as a high density plasma (HDP). It is preferred that the frequency of the r.f. energy be 13.56 MHz, a commercial standard frequency. Generator 14 typically operates at a standard 50 ohm impedance, and matching network 14a, well known in the art, allows efficient coupling of the r.f. energy into the plasma source 12. Alternatively, gas is conveyed into the process chamber 16 via second gas injection manifold 17, whereby the gas migrated into the plasma chamber 18 and is excited into a plasma state as described directly above.

Referring again to FIG. 2, the first gas manifold 15 is illustrated as assembled on the plasma assembly. Further detail is appreciated with reference to FIG. 3a, which depicts a cross-sectional view of said manifold 15. In this embodiment, first. gas manifold 15 is substantially circular and is attached to the inner periphery surface of the plasma source assembly 12. The manifold 15 includes a plurality of gas inlet passages 31a and 31b formed in the fold base 30. For delivery of gaseous chemicals to the manifold 15, gas delivery lines (not shown) are connected to each of the gas inlet passages vias gas feed connectors 31a and 31b. In this embodiment two gas inlet passages are shown,. however additional gas inlet passages, or only one gas inlet passage may be used.

The gas inlet passages 31a and 31b individually lead to concentric circumferentially extending plenums 34a and 34b. The plenums extend through the manifold base 30 and are enclosed by plate 37 mounted to manifold base 30. Disposed within each plenum 34a and 34b is a plurality of holes 36, drilled in the cover plate 37 and extending the circumference of each plenum. In one embodiment, the plurality of holes 36 are generally disposed at the bottom of each plenum 34a and 34b and extend vertically through the cover plate 37. Alternatively, the holes 36 may be drilled at an angle through said cover plate 37. The configuration of the holes 36 are selected to provide optimum gas injection to plasma chamber 18 and the number, size, shape and spacing of the holes may vary. Moreover, concentric hole arrays may be drilled in cover plate 37 and extending the circumference of each plenum.

Figure 3A:
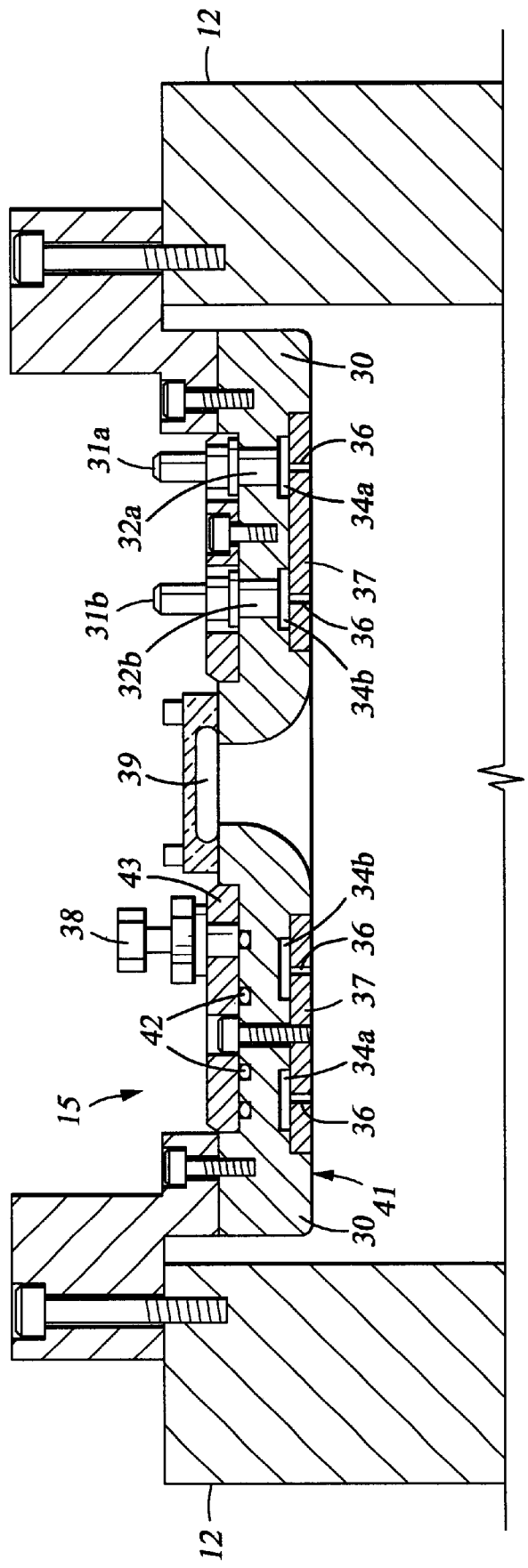
FIG. 3a illustrates a cross-sectional view of a first gas injection manifold according to one embodiment of the invention.
Figure 3B:
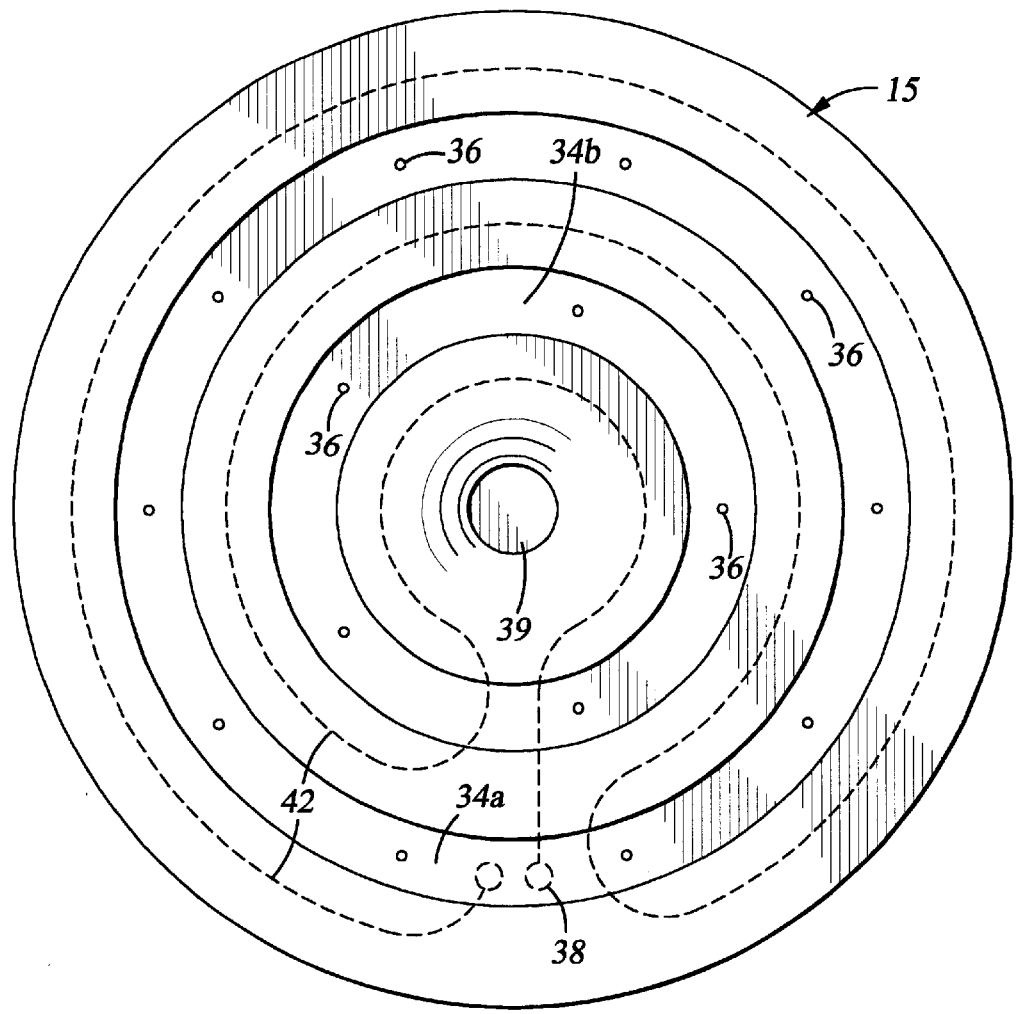
FIG. 3b is bottom plan view of the first gas injection manifold.
Figure 3C:
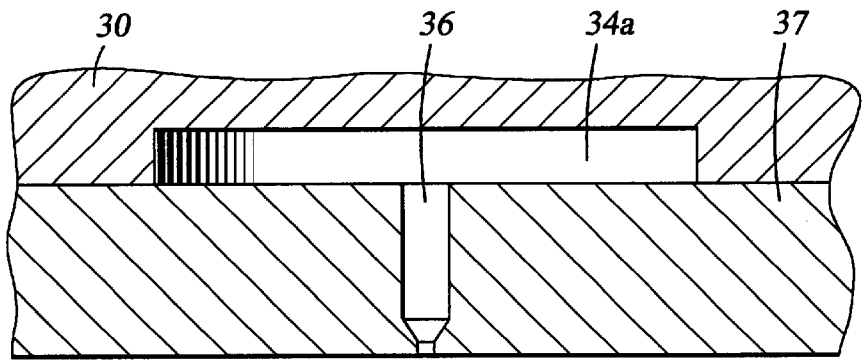

FIG. 3b illustrates a bottom plan view of first gas injection manifold 15. As shown in the present embodiment, the holes 36 generally form concentric circles in the bottom of first gas injection manifold 15. Preferably, the plurality of holes associated with the inner plenum 34b comprises five, and the plurality of holes associated with the outer plenum 34a comprises ten. FIG. 34c is an enlarged view showing the preferred shape of hole 36.

Thus, in the present embodiment, gas delivery lines convey gaseous chemicals to the manifold 15 via two gas feed connectors 31a and 31b. Each gas is discretely conveyed through the manifold 15 by passages 32a and 34b, to circular plenums 34a and 34b, whereby the gases exit the manifold 15 through a plurality of holes 36 associated with each plenum, into the plasma chamber 18.

The first gas manifold 15 employs a cooling system for cooling the manifold 15 during operation of the reactor 10. A cooling medium such as water is circulated through the manifold 15 to provide substantially uniform cooling. Maintaining uniform temperature during operation is important, as the reaction taking place at the surface of the wafer 24 is temperature dependent. Moreover, failure to maintain constant temperature may lead to flaking of deposits on the chamber walls and associated components, thereby creating particulates in the system.

In the present embodiment, the cooling medium is delivered through cooling feed connector 38 to a plurality of channels 42. The channels 42 extend through the manifold and are enclosed by a cover plate 43 mounted to the manifold base 30. The channels 42 extend across the manifold base 30 as shown in FIG. 3b. In modifications to the invention, the cooling system may be configured differently.

A sight glass 39 is suitably disposed in the center of the gas injection manifold 15 for providing an optical interface to view the plasma dhhharge. Preferably, the sight glass is circular and is made of sapphire, which resists attack from the plasma and chemicals. Furthermore, sight glass 39 allows line of sight access to the wafer plane to allow remote diagnostics to be employed such as a laser interferometer (visible) to observe film growth, and a laser interferometer (IR) to observe wafer temperature.

Preferably, the manifold 15 has a substantially smooth, planar surface for minimizing the depositing of particulate thereon. In this embodiment the manifold 15 is made from aluminum and has a near polished surface finish.

C. Process Chamber

In order to process semiconductor wafers and other ICs, the reactor 10 includes a process chamber 16 which is attached to and communicates with plasma assembly 11. Referring again to FIGS. 1 and 2, the internal structure of the process chamber 16 is illustrated in further detail Preferably, the process chamber 16 is cylindrical and is made of a material such as aluminm The process chamber 16 preferably includes means for a circulating a cooling medium, such as water, such means formed within the process chamber 16 wall, or alternatively disposed on the outside of process chamber 16, in order to maintain the process chamber 16 at a constant temperature. A second gas injection manifold 17 is disposed within the process chamber 16 and generally extends along the surface of the chamber, forming a ring. Also positioned within the process chamber 16 is wafer support 20 which supports a wafer 24 to be processed. Preferably the wafer support 20 is substantially aligned with the axis of the process chamber 16, and thus, second gas manifold 17 encircles the wafer support 20. A valve (not shown), such as a gate valve, is disposed in a side wall of the process chamber 16 to allow access to the interior of the chamber 16 for transporting the wafer 24 to and from the wafer support 20. Positioned beneath the wafer support 20 and substantially aially aligned with the axis of the process chamber 16 is a pump 26 and isolation valve 25.

Figure 4:
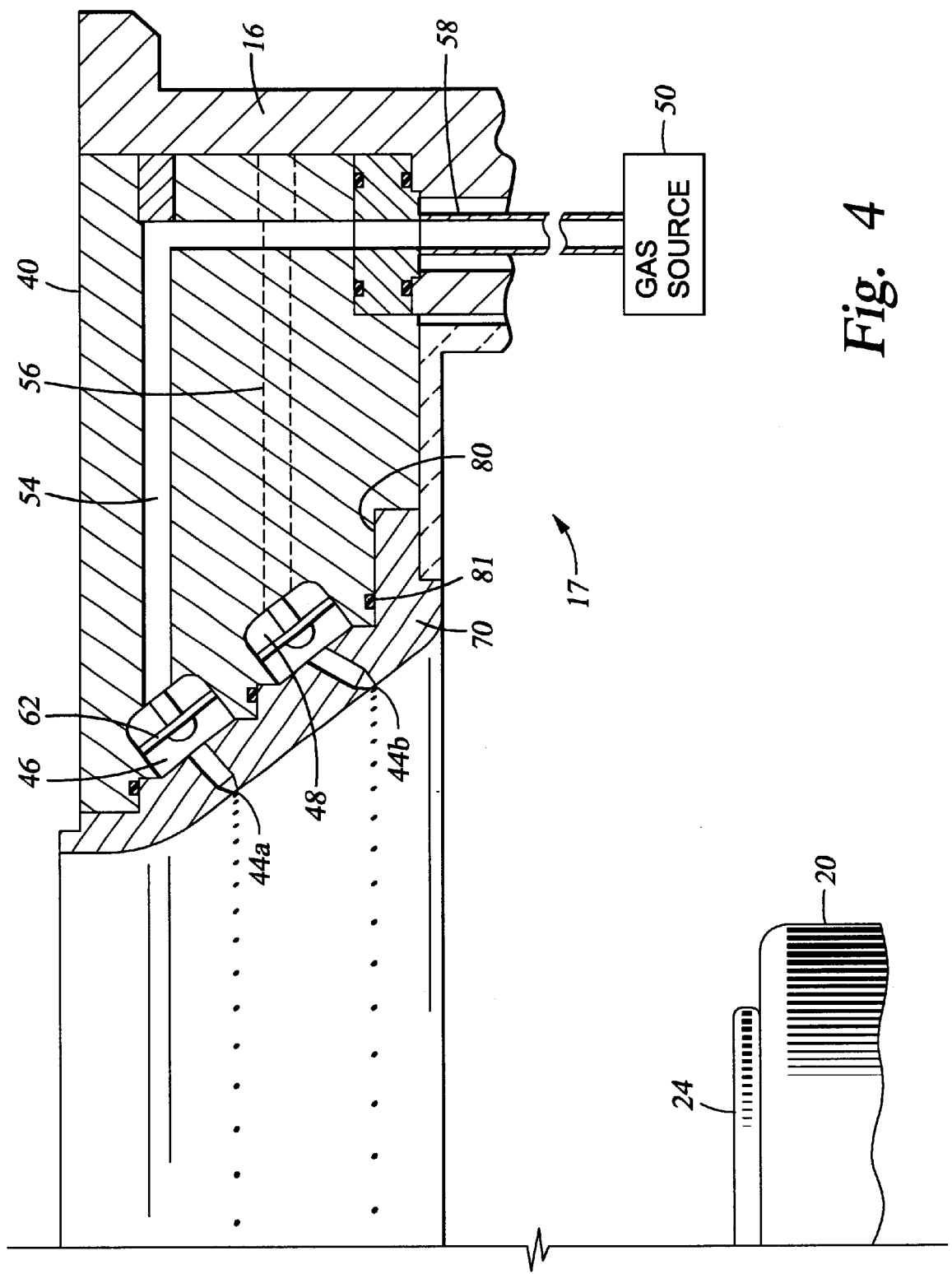
FIG. 4 represents a front plan view, partially broken away, of one embodiment of a second gas injection manifold in accordance with the invention.

The second gas injection maiold 17 is shown more particularly in FIG. 4. Second gas injection manifold 17 is described in further detail in co-pending application, Ser. No. 08/499,861 Flehr, Hohbach, Test et al., which is incorporated by reference hercin. Generally, the rmafold 17 includes a plenum body 40 mountable to the process chamber 16, a replaceable nozzle structure 70 removably mounted to the plenum body 40 and at least one plenum formed for receiving a gaseous chemical. The plenum body is formed with at least one conduit which is coupled to the plenum for conveying the gaseous chemical to the plenumn The nozzle structure 70 has a plurality of nozzles 44a and 44b coupled to the plenum and configured for injecting the gaseous substance from the plenum to the chamber. In the present embodiment, the first gas m old 17 has an annular configuration with an outer peripheral surface being mounted to the process chamber 16 wall; however, other configurations are within the scope of the invention.

As shown in FIG. 4, the preferred embodiment of the manifold 17, the plenum body 40 has two parallel, circumferentially extending channels 46 and 48 formed in the plenum body 40. The channels 46 and 48 partially define a pair of plenums for discretely receiving the gaseous cheicals employed in the processing of the wafer. Channels 46 and 48 are each connected to a gas source 50 and 52 (not shown) through conduits 54 and 56 via supply lines 58 and 60 (not shown). Supply lies 58 and 60 extend vertically to intersect the conduits 54 and 56, and is referred to as "bottom feed" of the gases. In an alternative embodiment, the supply lines 58 and 60 may be configured to extend horizontally through the process chamber 16 wall, as a "side feed."

Preferably, a baffle 62 formed with a plurality of openings (not shown) is mounted in each channel 46 and 48 as is known in the art. Baffles 62 interrupt the flow of gas from the conduits 54 aind 56 to the nozzles 44a and 44b adjacent the nozzles to diffuse the gas and more uniformly distribute the flow of the gas around the circumference of the plenum body 40. The configuration of the baffles 62 is selected to provide optimum distribution of the gases and is subject to considerable variation. Moreover, the baffles 62 may be omitted if desired.

The nozzle structure 70 is removably mounted to the plenum body 40, covering the channels 46 and 48 enclosing the plenums. The nozzle structure 70 includes 2 plurality of first nozzles 44a substantially aligned with the channel 46 and a plurality of second nozzles 44b aligned with the channel 48 for injecting the gaseous substances retained in the plenums into the process chamber 16. The size, shape, spacing, angle and orientation of the nozzles may vary considerably. The nozzles 44a and 44b are preferably configured to provide the layers formed on the surface of wafer 24 with a substantially flat profile. Plenum body 40 and nozzle structure 70 include mating surfaces 80 and 81 which are formed to maximize the surface contact between the plenum body 40 and the nozzle structure 70 to couple the nozzle structure to ground.

During operation of the reactor 10, and particularly during PECVD processing of the wafer 24, the nozzle structure 70 is exposed to the plasma. The gas injection manifold 17 is preferably grounded unless the nozzle structure 70 is formed of a dielectric material.

Manifold 17 is of particular advantage in high density plasma enhanced CVD processing because of the effects on the gas flow of factors such as the high density of the plasma) the low pressure of the reactor 10 of less than 3–4 mTorr, as cormared to more than 100 mTorr for conventional plasma enhanced systems, and the relatively high electron temperature $T_e$. Because of the lower chamber pressure, the mean free path is large and causes quick dispersion of the gaseous chemical away from the injection point (i.e. the outlet of second gas injection manifold 17), thus the close proximity of the manifold 17 to the surface of the wafer 24 allows the efficient use of chemicals and promotes a uniform gas distribution across the wafer plane.

Figure 7:
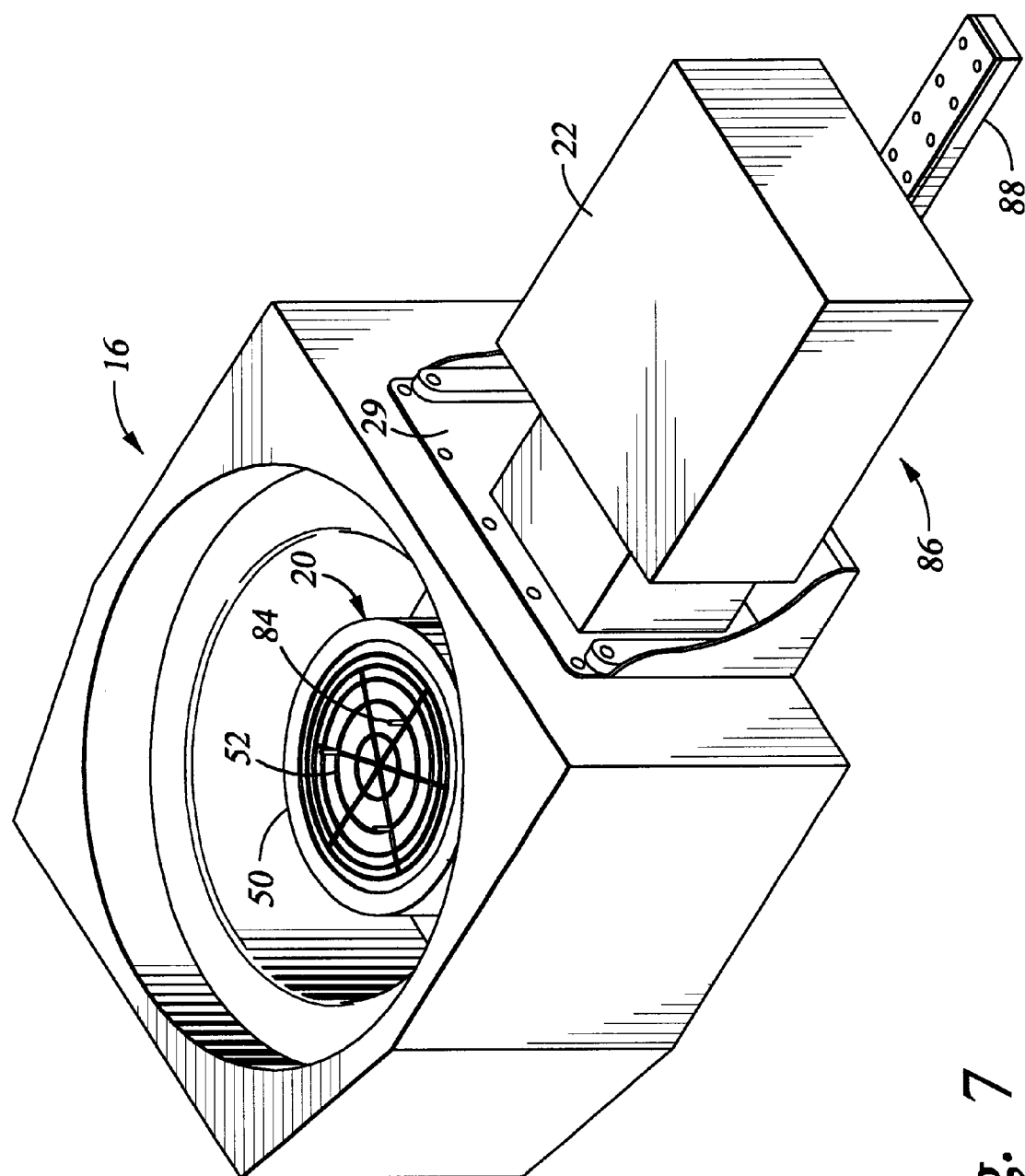
FIG. 7 is an enlarged side elevation showing the substrate support, partially broken away, mounted in the reactor in accordance with one embodiment of the invention.

As mentioned above, for securing the wafer 24 during processing, a wafer support 20 is provided in process chamber 16. The wafer support 20 is generally described below, however, further detail is provided in co-pending application, Ser. No. 08/500,480, Flehr, Hohbach, Test et al., which is incorporated by reference herein. Referring to FIGS. 2, 5b and 7, the wafer support 20 generally includes a support body 50 having a support surface 52 for retaining a wafer 24, a volage source 74 coupled to the support body for electrostatically coupling the wafer to the support surface, and a cooling systerm 78 for cooling the wafer. The cooling system includes a plurality of gas distribution grooves (not shown) formed in the support surface 52 for uniformly distributing a gaseous substance between the wafer 24 and the support surface 52. The cooling system includes a restriction mechanism (not shown) in the conduit between the gas source and the gas distribution grooves to substantially prevent catastrophic separation of the wafer 24 from the support surface 52 in the event a portion of the wafer becomes separated from the support surface 52. At least one arm member 21 extending from the support body 50 is mountable to the process chamber 16 with the support body 50 and the arm member 21 being separated from the bottom of the process chamber 16. Referring to FIG. 7, in the present embodiment the arm member 21 is mounted to a carriage assembly 86 and 88 which in turn is releasably secured by plate 29 to the process chamber 16.

The wafer 24 is lowered onto and raised from the support surface 52 by a lifting assembly (not shown). The lifting assembly includes a plurality of lifting pins 84 which extend through apertures formed in the support surface 52 and an electrode assembly (not shown). The lifting pins 84 are movably between an extended position whereby the pins retain the wafer 24 above the support surface 52, and a retracted position.

The wafer support 20 employs a cooling system for cooling the wafer during processing. A gaseous substance such as helium, argon, oxygen, hydrogen and the like, is distributed between the support surface 52 and the wafer 24 to provide substantially uniform cooling across the entire wafer 24. Maintaining the entire wafer at a uniform teperature during processing significantly improves the uniformity of the layers formed on the wafer surface.

In the present embodiment, the wafer support 20 is particularly adapted for use with PECVD processing. The electrode assembly (not shown) includes means for applying an r.f. bias to the support body 50. Electrode assembly includes a pair of electrical connectors (not shown) which couple inner and outer electrodes and, respectively, to an r.f. source 23 and a matching network 22. Applying an r.f. bias to the support surface 52 increases the floating potential of the plasma in the localized area of the support surface 52. The self-bias induced by applying the r.f. bias to the support surface 52 accelerates ions difflsing into the plasma sheath in the region of the wafer support 20 and towards the wafer 24. This enhances sputter etching which is desirable in the formation of void-free layers of material on the surface of the wafer 24.

The frequency of the r.f bias applied to the wafer support 20 is within the range of 1–60 MHz. Preferably, the ri frequency of the plasma source 12 is different from that of the wafer support 20 to minimize frequency beating. Preferably, the frequency of r.f. applied to the wafer support 20 is approximately 3.39 MHz, and the plasma source 12 operates at approximately 13.56 MHz Plenum body 40 and nozzle structure 70 include mating surfaces 80 and 81 which are formed to maximize the surface contact between the plenum body 40 and the nozzle structure 70 to couple the nozzle structure to ground. During processing, the wafer 24 is positioned on the support surface 52, and particularly placed on lifter pins 54, by a transport device known in the art (not shown). DC voltage is applied to the at least one electrode of the wafer support 20, to electrostatically attract and securely retain the wafer to the support surface 52. After processing the wafer 24, the electrode is substantially grounded in order to sufficiently deactivate the electrostatic charge for release of the wafer 24 from the support surface 52. Preferably, the support body 50 includes two electrodes whereby positive voltage is applied to one electrode, and negative voltage is applied to the other electrode. After the wafer 24 is removed from the process chamber 16, preferably the polarity of the electrodes is reversed for the next wafer.

The unique mounting of the wafer support 20 in the process chamber 16 is of particular advantage in processing the wafer 24 substantially due to the promotion of symmetrical gas flow. Referring again to FIG. 2, at least one arm member 21 mounts the wafer supports 20 to the process chamber 16 such that the wafer support 20 is suspended with the process chamber 16. Suspending the wafer support 20 such that it is removed from the bottom of the process chamber 16, unlike prior art systems, offers improved flow control during processing and increased flexibility in the design of the overall reactor 10. In the preferred embodiment, the vacuum system pump 26 is substantially axially aligned with the process chamber 16, minimizing the footprint of the reactor 10 and improving the effectiveness of the pump during operation.

Figure 5A:
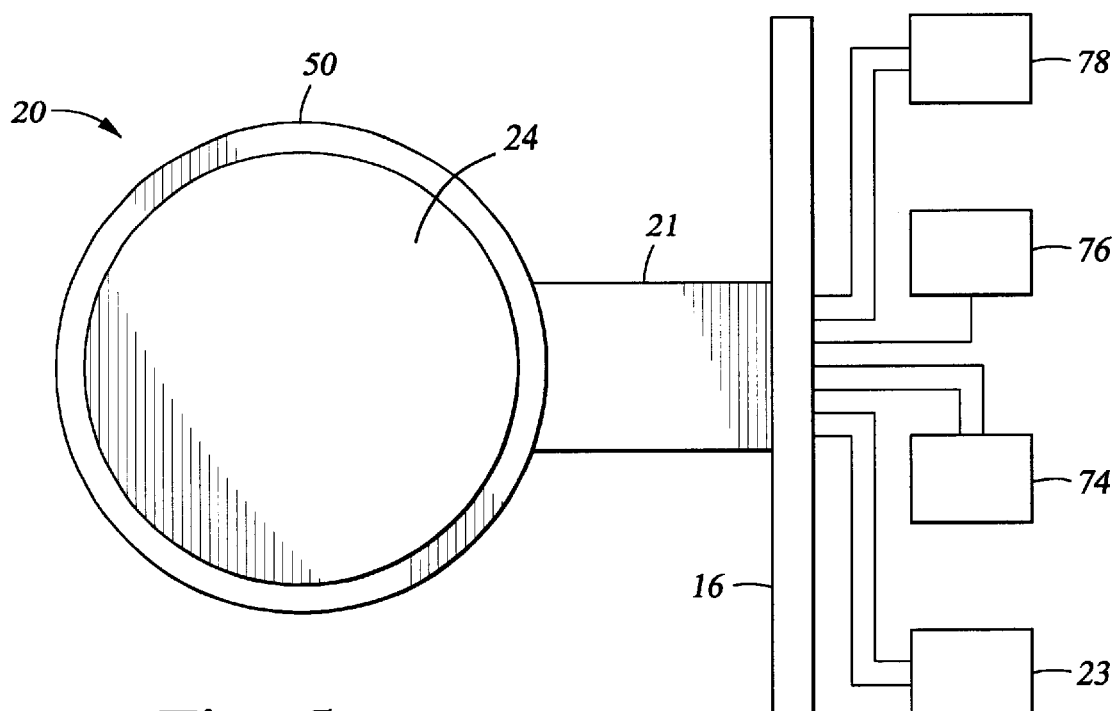
FIG. 5a is a top plan view showing the substrate support mounted in the reactor.
Figure 5B:
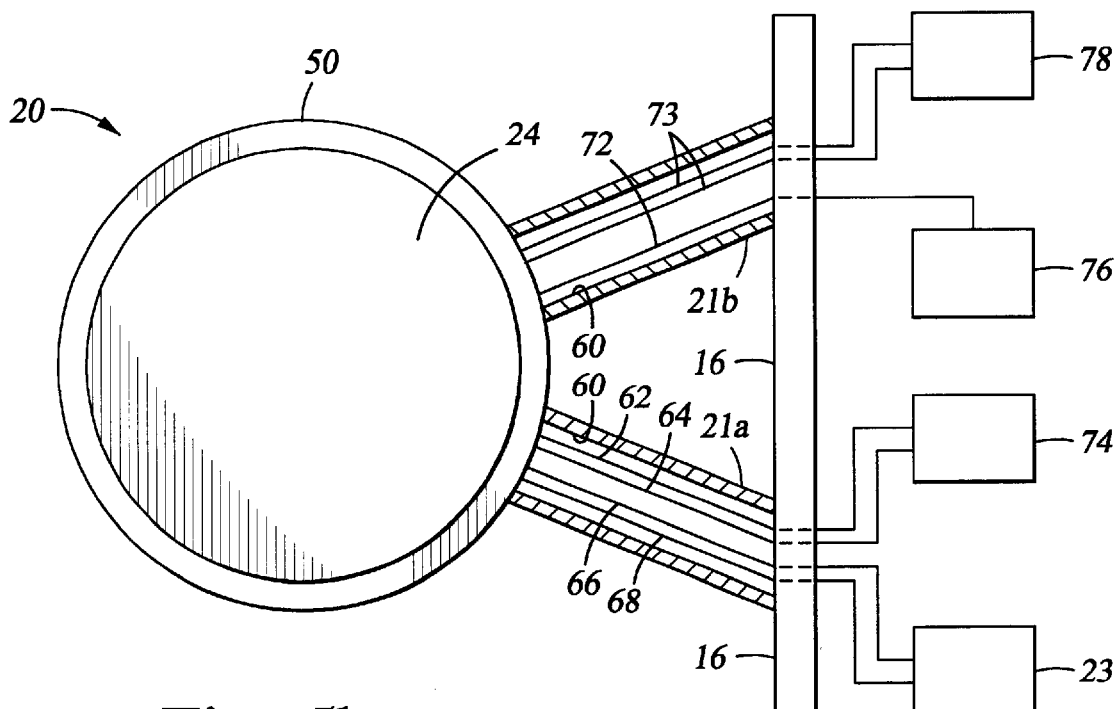
FIG. 5b depicts an alternate embodiment of the substrate support, partially broken away, mounted in the reactor in accordance with the invention.

Turning to FIGS. 5a and 5b, two embodiments of the wafer support 20 mounted in the process chamber 16 are shown. Preferably, two arm members 21a and 21b extending toward one wall of the process chamber 16 are employed as depicted in FIG. 5b; however, it is to be understood that the number of arm members 21, and their position where attached to the process chamber 16, may vary.

Arm members 21a and 21b are each formed with a longitudially extending bore 60 as illustrated in FIG. 5b. The bore of one arm member 21a provides a conduit from the support body 50 for the electrical connectors 62 and 64 which couple the electrodes of the wafer support 20 to the voltage source 74. Further, electrical connectors 66 and 68 couple the r.f. source 23 to the electrodes. The gas source 76 and the fluid source 78 for the electrodes assembly are connected to the support body 50 through conduits 72 and 73, respectively, which extend through the bore 60 of arm member 21b. Alternatively, FIG. 5a illustrates the use of one arm member 21 mounted to process chamber w1 16 whereby the fluid source 78, gas source 76, dc and r.f. sources 74 and 23 and their respective connections extend through the bore of arm member 21 to the wafer support 20.

Operatively attached to the process chamber 16 is a vacuum system for an opening 27, exhausting the reactor 10. Referring again to FIG. 1, the vacuum system includes a pump 26 and preferably a vacuum isolation valve 25 positioned beneath wafer support 20 and the bottom of the process chamber 16. Preferably, the pump 26 and valve 25 are mounted substantially axially aligned with the process chamber 16. Such inventive "on-axis" pumping is of particular advantage, and promotes symmetrical flow of gases within the reactor 10. Pump 26 and valve 25 preferably are a turbo pump and a gate valve, respectively, as known in the art.

Figure 6:
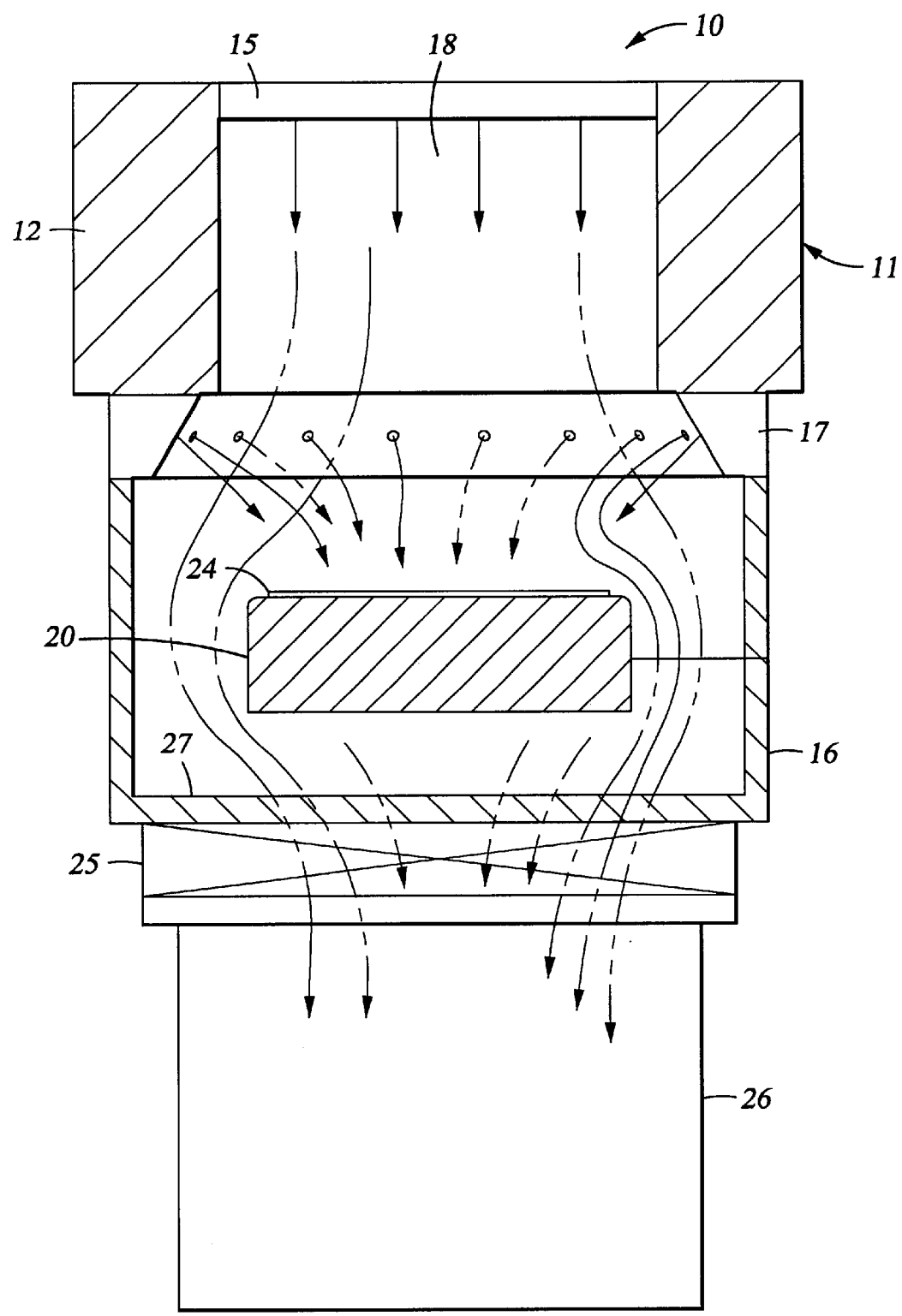
FIG. 6 is a cross sectional view of an embodiment of a reactor illustrating the flow of gases within the system in response to the on-axis placement of the pump.

A particular advantage of the invention is the symmetrical flow of the gases within the reactor provided by the inventive design, and the corresponding reduction of interference with the symmetry of the pump flow in the region proximate the wafer 24. Referring to FIG. 6, the symmetrical flow within the reactor 10 is represented by flow lines.

According to the inventive reactor described herein, the placement of the side mounted substrate support 20 and the on-axis pumping form aunique gas distribution system that is designed to provide symmetrical flow of gases within the reactor 10, and particularly to promote uniform deposition and/or etching across the wafer 24.

Figure 8:
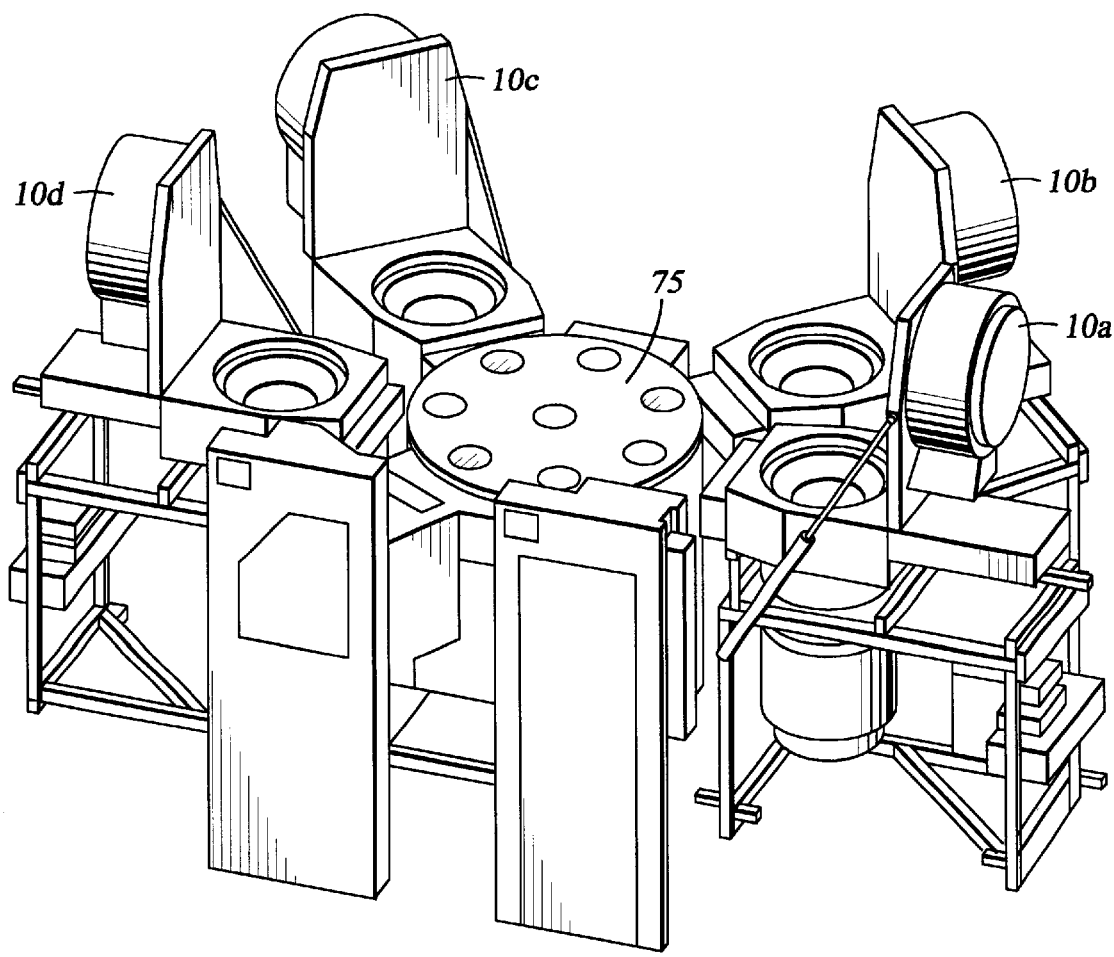
FIG. 8 is a simplified block diagram illustrating a PECVD system with a plurality of reactors in accordance with an alternative embodiment of the invention.

FIG. 8 depicts an alternative embodiment of the invention, wherein a plurality of reactors 10a–d are connected by a common transport module 75 known in the art, for processing a plurality of wafers. Each reactor 10a, 10b, 10c and 10d may perform a separate processing step, or the same processing step may be performed in each reactor.

D. Operation of the Reactor

To promote extension of the plasma into the process chamber 16, the inventive reactor induces a potential gradient causing diffusion of the plasma. Plasma is generated close to coil 13 aid will diffuses out in any direction. Referring aga to FIG. 3a, first gas injection manifold has a surface 41 which acts to reference the plasma to a voltage potential. To direct the plasma, first gas injection manifold 15 preferably is grounded which induces the plasma to generate a slight positive chrge at the surface 41 of the manifold 15 (i.e. the plasma potential). Alternatively, first gas injection mnaifold 15 may be held at some potential, instead of ground. Thus, the plasma is referenced to a particular potential in the localized area of the surface 41. The plasma extends into the plasma chamber 16, and ambipolar diffusion of the plasma will replenish any loss of charged particles in the process chamber 16, providing for a steady supply of charged particles in the region where chemistry is taking place, i.e. at wafer support 20. Moreover, the plasma generated is a "cold plasma," i.e. the plasma potential is low. Thus the potential at the walls is very low, so the plasma is less likely to erode the walls of the chanber which minimizes metal contamination. Plasma is cold substantially due to the electrostatic shield 19 which forces the pimary ionization mechanism to be inductive.

Upon application of r.f. bias, a self bias is induced at the wafer support 20 and wafer 24. Control of the self bias may be effected by considering the ratio of the area of the bias r.f. current return path and the area of the wafer. In one embodiment durng the deposition operation, the self bias accelerates ions from the plasma sheath in the reactor to the surface of the wafer 24. The ions sputter etch the layer of material as it is deposited thereby enhancing deposition of a void-free, dense good quality film. The r.f. bias applied to the wafer support may range from 75 to 400 volts, and preferably is approximately 300 volts for an r.f. bias power of 1700 Watts.

It is desirable to choose the bias frequency such that it minimizes interference with the frequency of the plama source 12 (i.e. intermodulation), and yet is sufficiently high in frequency as to allow for the induction of the dc self bias at the wafer and to achieve such bias without excessive power requirements. Generally, lower frequencies generate larger induced voltages at the cost of ripple on top of the induced voltage. The sputter etch rate at the wafer 24 surface is proportional to the induced bias. An acceptable compromise if found at frequencies greater than 2 MHz and less than or equal to 13.56 MHz. The preferred embodiment employs a r.f. bias frequency applied to the wafer support 20 of 3.39 MHz; whose first harmonic coincides with a Federal Communications Commission (FCC) 6.78 ISM frequency ( which stands for the Instruments, Scientific and Medicai frequency band), and is sufficiently different from the rf plasma source 12 frequency to prevent intermodulation thereby minimizing control system instabilities.

Figure 9:
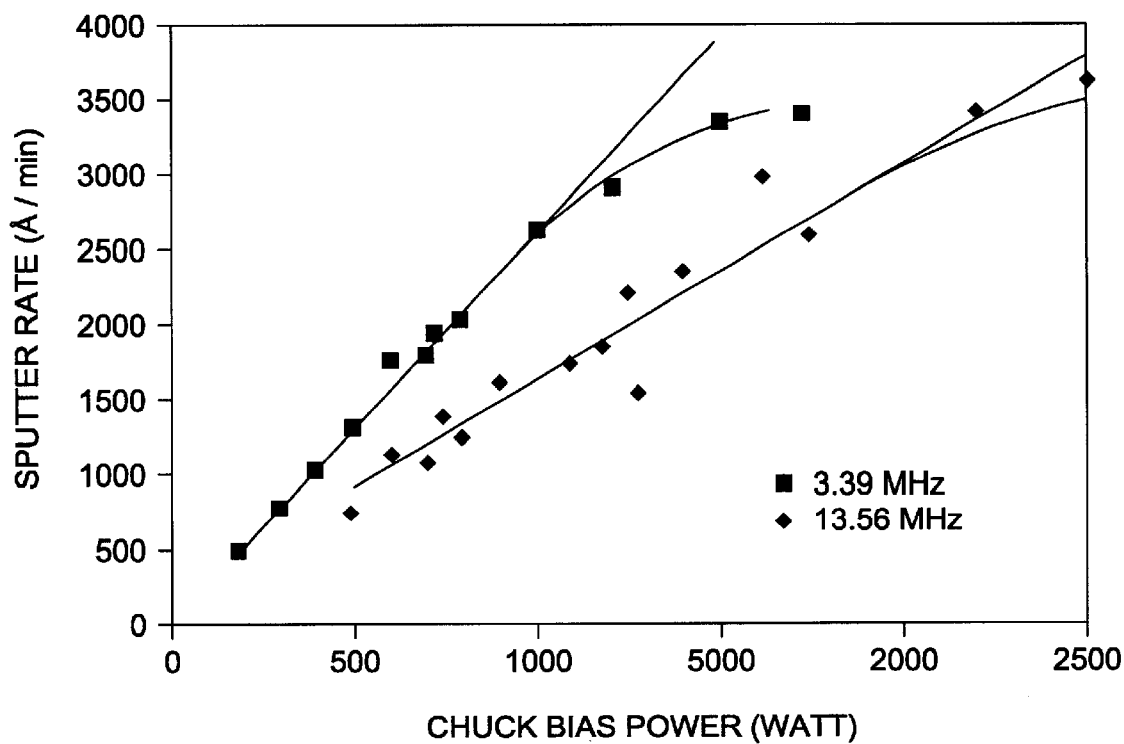
FIG. 9 illustrates sputter rate as a function of substrate support bias power.

The dependency of the sputter etch rate on the bias frequency is illustrated in FIG. 9. A wafer 24 with a layer of oxide is placed on the wafer support 20. The reactor 10 pressure is approximately 1.8 mTorr, and argon gas at approximately 100 sccm is injected into the process chamber 16. Two different bias frequencies, 3.39 MHz and 13.56 MHz, are applied, and the sputter etch rate is plotted as a function of bias power applied to the wafer support 20 for the two frequencies.

Circulating r.f energy fields are present in the reactor 10, and are of a particular concern when proximate to the wafer 24 in the process chamber 16. One particular advantage of the invention is the function of the second gas injection manifold 17 as a r.f. current return path for the r.f. currents generated by biasing the wafer support with r.f. energy. A substantial amount of the circulating r.f. currents find a return path through the Outsold 17. Referring again to FIG. 4, the second gas injection manifold 17 is well grounded through mating surfaces 80 and 81 which are preferably plated with a suitable material such as nickel to enhance the metal surface-to-surface contact between the plenum body 40 and the nozzle section 70. The interfacing surfaces of the metal are designed to promote low impedance contact and employs a special gasket material such as a spiral shield known in the art. The manifold 17 is coupled to ground and the mating surfaces 80 and 81 provide the return path for the r.f. energy generated when an r.f. bias is applied to the wafer support 20. The r.f. currents travel along surfaces, not through the bulk of the metal; accordingly, the gasket material is placed close to the metal interfaces. Moreover, the placement of manifold 17 within the process chamber 16 is important; the manifold 17 is placed in close proximity to the wafer support 20 as compared to the proximity of the plasma source 12 and first gas injection manifold 15 to the wafer support 20. The circulating r.f. currents generally encounter the second gas injection manifold 17 and are removed before encountering the other components. In the event the r.f. currents were to return through the plasma source 12, unlike in the present invention, the resonance in the plasma source 12 could be adversely affected. Also, as described above, the frequencies are sufficiently different to prevent such occurrences.

The reactor 10 of the invention is particularly suitable for providing stable, substantially repeatable operation by providing isolation of the r.f. currents and plasma potential of the source 12 and first manifold 15, from the wafer support 20. Such isolation allows the plasma potential at the surface 41 of the first gas manifold 15 to be well defined and maintained. Without anwell defined plasma potential, the system may differ from day to day depending upon the amount of plasma contact with the surface 41 of the first gas mnif old 15, causing the system to drift and adversely effect the repeatability of the deposition process. It is important to note that the mechanical configuration of the second gas manifold 17 may vary considerably while achieving the same r.f. return function as described above, and that all such mechanical variations are within the scope of the invention.

As mentioned above a particular advantage of the invention is the symmetrical flow of the gases within the reactor provided by the inventive design and the on-axis pump in particular, which corresponds to a reduction of interference with the symmetry of the pump flow in the region proximate the wafer 24. Referring again to FIG. 6, the symmetrical flow within the reactor 10 is represented by flow lines, and shows desirable uniform radial flow at the wafer plane. At low pressures the mean free path of the gas is relatively long, providing fewer collisions between molecules. It is desirable for the gas density to be highly uniform in the area proximate to the wafer. This is enhanced by the reactor by providing equal effective pumping speed around the wafer plane at the wafer support 20. Equal effective pumping speed is accomplished by axially aligning the wafer and the pump with the process chamber, so that the geometric orientation (the spacing between the opening of the vacuum system and the wafer support and the size of the opening) promotes equal-distance flow around the wafer. Thus, the flow of gas is symmetrical across the wafer which enhances uniform processing of the wafer. Moreover, during the reactor self-clean operation, gases are preferably injected through first gas injection manifold 15 and having the pump along the axis of symmetry aces uniform gas flow, and thus cleaning action, throughout the reactor 10.

Figure 10A:
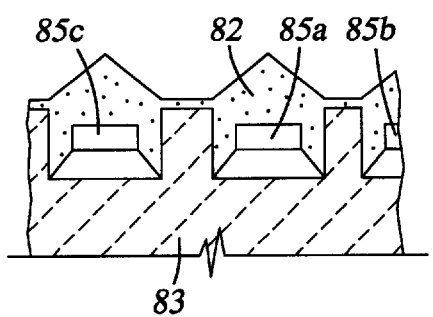
FIGS. 10a and 10b are cross-sectional views of surface topography of semiconductor wafers processed in the reactor of the invention.
Figure 10B:
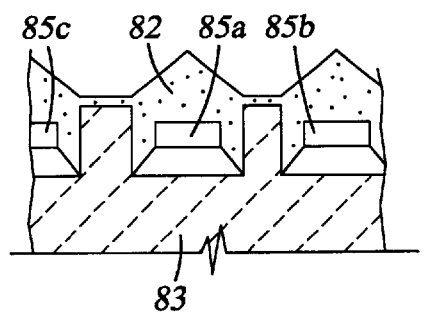

The inventive reactor 10 design promotes deposition of uniform films as illustrated by FIGS. 10a and 10b. A wafer 24 is provided having a substrate 83 with a plurality of device features 85a–c formed thereon. The gap spacing between device features 85a and 85b 0.25 microns, and the gap spacing between device features 85a and 85c is 0.30 microns. The aspect ratio is 2.5:1. An oxide layer 82 is deposited on device features 85 and substrate 83 in the reactor of this invention. As shown the reactor 10 and method successfully deposit void-free layers filling the 0.25 and 0.30 micron gaps with excellent step coverage.

Figure 11:
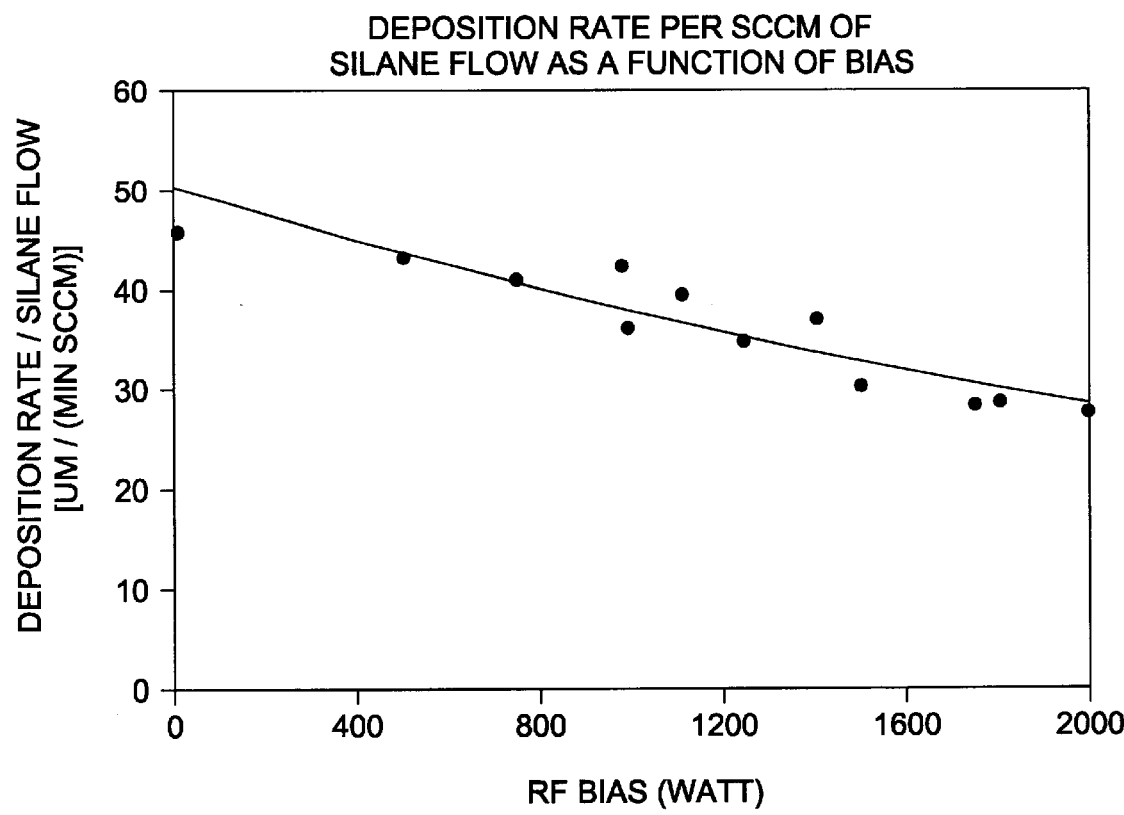
FIG. 11 illustrates the deposition rate per silane flow as a function of the applied r.f. bias.

Referring to FIG. 11, the deposition rate as a function of r.f. bias applied to the wafer support in the invention is illustrated. The deposition rate is normalized and is represented as: the deposition rate per silane flow (in angstroms per minute per sccm) which is then plotted as a function of r.f. bias power (watts) applied to the wafer support.

The foregoing description ofspecific embodiments of the invention have been presented for the purpose of illustration and description. They are not intended to be exhaustive or to limit the invention to the precise forms disclosed, and obviously many modifications, embodiments, and variations are possible in light of the above teaching. It is intended that the scope of the invention be defined by the claims appended hereto and their equivalents.

What is claimed is:

1. An apparatus for holding a substrate in a processing chamber, comprising:

a substrate support member having a body portion and a substrate support surface; and one or more arms extending from the body portion to connect the substrate support member to a base, the base being rigidly mounted to a side wall of the processing chamber.

2. The apparatus of claim 1, wherein the substrate support surface substantially conforms to the side wall of the processing chamber.

3. The apparatus of claim 1, wherein the one or more arms radially extend from the body portion to the base of the processing chamber.

4. The apparatus of claim 1, wherein the substrate support surface further comprises an electrostatic chuck.

5. The apparatus of claim 1, wherein the one or more arms comprises one or more conduits providing one or more passageways to connect at least one of a fluid source, a gas source, a DC source and an RF source.

6. The apparatus of claim 1, wherein the side wall portion comprises a movable wall.

7. The apparatus of claim 6, further comprising:

a carriage assembly attached to the movable wall, wherein the carriage assembly is adapted to move the substrate support member between a processing position inside the processing chamber and a cleaning position outside of the processing chamber.

8. An apparatus for processing a substrate, comprising:

a processing chamber;

a substrate support member having a body portion and a substrate support surface; and one or more arms extending from the body portion to fixedly mount the substrate support member to a carriage assembly attached to a side wall portion of the processing chamber for processing.

9. The apparatus of claim 8, wherein a peripheral edge of the substrate support member substantially conforms to an adjacent side wall portion.

10. The apparatus of claim 8, wherein the one or more arms extend in a substantially lateral direction between the body portion and the side wall portion of processing chamber.

11. The apparatus of claim 8, wherein the substrate support surface further comprises an electrostatic chuck.

12. The apparatus of claim 8, wherein the one or more arms comprises one or more conduits providing one or more passageways to connect at least one of a fluid source, a gas source, a DC source and an RF source.

13. The apparatus of claim 8, wherein the carriage assembly is adapted to move the substrate support member disposed on the movable wall between a processing position inside the processing chamber and a cleaning position outside of the processing chamber.

14. The apparatus of claim 8, wherein the processing chamber includes:

one or more gas inlets disposed above the substrate support member; and an exhaust system disposed substantially axially below the substrate support member.

15. The apparatus of claim 14, wherein the side wall of the processing chamber and the substrate support memberdefine a substantially axial gas flow from the one more gas inlets to the exhaust system.

* * * * *

UNITED STATES PATENT AND TRADEMARK OFFICE
CERTIFICATE OF CORRECTION

PATENT NO. : 6,375,750 B1
DATED : April 23, 2002
INVENTOR(S) : van Os et al.

It is certified that error appears in the above-identified patent and that said Letters Patent is hereby corrected as shown below:

Column 1,
Line 58, please change "addressedWith" to -- addressed. With --.

Column 3,
Line 42, please change "refold" to -- manifold --.

Column 4,
Line 22, please change "selfclean" to -- self-clean --.
Line 27, please change "deaning" to -- cleaning --.
Line 41, please change "Qf" to -- of --.
Line 42, please change "xhe" to -- the --.
Line 49, please change "wallPreferably," to -- wall. Preferably, --.
Line 51, please change "Plasm" to -- Plasma --.

Column 5,
Line 8, please change "processedBy" to -- processed. By --.
Line 43, please change "31a and 31b" to -- 32a and 32b --.
Line 43, please change "fold base" to -- manifold --.
Line 47, please change "shown,. however" to -- shown. However --.
Line 50, please change "31a and 31b" to -- 32a and 32b --.

Column 6,
Line 33, please change "dhhharge" to -- discharge --.
Line 49, please change "detailPreferably" to -- detail. Preferably --.

Column 7,
Line 1, please change "aially" to -- axially --.
Line 7, please change "rmafold" to -- manifold --.
Line 13, please change "plenumnThe" to -- plenum. The --.
Line 17, please change "m old" to -- manifold --.
Line 25, please change "cheicals" to -- chemicals --.
Line 37, please change "aind" to -- and --.
Line 46, please change "includes 2 plurality" to -- includes a plurality --.
Line 67, please change "plasma)" to -- plasma, --.

Column 8,
Line 1, please change "cormared" to -- compared --.
Line 20, please change "systerm" to -- system --.
Lines 50-51, please change "tepera-ture" to -- tempera-ture --.
Line 63, please change "difflsing" to -- diffusing --.

UNITED STATES PATENT AND TRADEMARK OFFICE
CERTIFICATE OF CORRECTION

PATENT NO.    : 6,375,750 B1
DATED         : April 23, 2002
INVENTOR(S)   : van Os et al.

It is certified that error appears in the above-identified patent and that said Letters Patent is hereby corrected as shown below:

Column 9,
Line 2, please change "ri" to -- r.f. --.
Line 7, please change "MHzPlenum" to -- MHz. Plenum --.
Line 30, please change "supports" to -- support --.
Line 59, please change "w1" to -- wall --.
Line 65, after "includes" please insert -- an opening 27 --.

Column 10,
Line 31, please change "aga" to -- again --.
Line 35, please change "chrge" to -- charge --.
Line 37, please change "mnaifold" to -- manifold --.
Line 55, please change "durng" to -- during --.
Line 64, please change "plma" to -- plasma --.

Column 11,
Line 10, please change "Medicai" to -- Medical --.
Line 31, please change "Outsold" to -- manifold --.
Line 66, please change "anwell" to -- a well --.

Column 12,
Line 2, please change "mnif old" to -- manifold --.
Line 34, please change "accs" to -- enhances --.

Column 14,
Line 27, please change "memberdefine" to -- member define --.

Signed and Sealed this

Twenty-eighth Day of October, 2003

JAMES E. ROGAN
*Director of the United States Patent and Trademark Office*